United States Patent
Kaibara et al.

(10) Patent No.: US 7,663,161 B2
(45) Date of Patent: Feb. 16, 2010

(54) TRANSISTOR FOR PREVENTING CURRENT COLLAPSE AND HAVING IMPROVED LEAKAGE CURRENT CHARACTERISTICS AND METHOD FOR FABRICATING THE SAME

(75) Inventors: Kazuhiro Kaibara, Osaka (JP); Masahiro Hikita, Hyogo (JP); Tetsuzo Ueda, Osaka (JP); Yasuhiro Uemoto, Shiga (JP); Tsuyoshi Tanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/939,899

(22) Filed: Nov. 14, 2007

(65) Prior Publication Data

US 2008/0149965 A1   Jun. 26, 2008

(30) Foreign Application Priority Data

Dec. 21, 2006   (JP) .............................. 2006-344323

(51) Int. Cl.
| | |
|---|---|
| H01L 31/0328 | (2006.01) |
| H01L 31/0336 | (2006.01) |
| H01L 31/072 | (2006.01) |
| H01L 31/109 | (2006.01) |
| H01L 29/739 | (2006.01) |
| H01L 29/732 | (2006.01) |
| H01L 29/22 | (2006.01) |
| H01L 33/00 | (2006.01) |
| H01L 29/06 | (2006.01) |

(52) U.S. Cl. ........................... 257/192; 257/20; 257/94; 257/183; 257/194; 257/195; 257/E29.246; 257/E29.248; 257/E29.249; 257/E29.253; 257/E29.254

(58) Field of Classification Search ......... 257/194–195, 257/E29.246, E29.248, E29.249, E29.253, 257/E29.254, 20, 94, 183, 192
See application file for complete search history.

(56) References Cited

U.S. PATENT DOCUMENTS 5,161,235 A * 11/1992 Shur et al. .................... 257/24

(Continued)

FOREIGN PATENT DOCUMENTS

JP   11-261053   9/1999

(Continued)

OTHER PUBLICATIONS

Kawasaki, T., et al., "Normally-off AlGaN/GaN HEMT with Recessed Gate for High Power Applications", Extended Abstracts of the 2005 International Conference on Solid State Devices and Materials, 2005, pp. 206-207.

(Continued)

Primary Examiner—Ida M Soward
(74) Attorney, Agent, or Firm—McDermott Will & Emery LLP

(57) ABSTRACT

A transistor includes: a first semiconductor layer and a second semiconductor layer with a first region and a second region, which are sequentially formed above a substrate; a first p-type semiconductor layer formed on a region of the second semiconductor layer other than the first and second regions; and a second p-type semiconductor layer formed on the first p-type semiconductor layer. The first p-type semiconductor layer is separated from a drain electrode by interposing therebetween a first groove having a bottom composed of the first region, and from a source electrode by interposing therebetween a second groove having a bottom composed of the second region.

14 Claims, 8 Drawing Sheets

U.S. PATENT DOCUMENTS

| | | | |
|---|---|---|---|
| 5,162,877 A * | 11/1992 | Mori | 257/25 |
| 5,298,441 A * | 3/1994 | Goronkin et al. | 438/172 |
| 6,908,799 B2 * | 6/2005 | Morizuka | 438/172 |
| 6,919,590 B2 * | 7/2005 | Hill et al. | 257/192 |
| 6,992,319 B2 * | 1/2006 | Fahimulla et al. | 257/20 |
| 7,038,252 B2 | 5/2006 | Saito et al. | |
| 7,199,408 B2 * | 4/2007 | Miyoshi | 257/194 |
| 7,352,008 B2 * | 4/2008 | Kohn et al. | 257/83 |
| 7,364,988 B2 * | 4/2008 | Harris et al. | 438/478 |
| 7,501,669 B2 * | 3/2009 | Parikh et al. | 257/194 |
| 7,504,679 B2 * | 3/2009 | Spring | 257/288 |
| 2004/0079964 A1 | 4/2004 | Hori et al. | 257/194 |
| 2006/0022217 A1* | 2/2006 | Passlack | 257/192 |
| 2006/0060871 A1 | 3/2006 | Beach | |
| 2006/0273347 A1 | 12/2006 | Hikita et al. | |
| 2007/0164314 A1* | 7/2007 | Beach et al. | 257/194 |
| 2008/0079023 A1 | 4/2008 | Hikita et al. | |
| 2008/0224148 A1* | 9/2008 | Shur et al. | 257/76 |
| 2009/0045438 A1* | 2/2009 | Inoue et al. | 257/192 |
| 2009/0065787 A1* | 3/2009 | Kikkawa et al. | 257/76 |
| 2009/0121775 A1 | 5/2009 | Ueda et al. | |

FOREIGN PATENT DOCUMENTS

| | | |
|---|---|---|
| JP | 2004-273486 | 9/2004 |
| JP | 2005-244072 | 9/2005 |

OTHER PUBLICATIONS

Kuroda, M., et al., "Normally-off Operation of Non-polar AlGaN/GaN Heterojunction FETs Grown on R-plane Sapphire", Extended Abstracts of the 2005 International Conference on Solid State Devices and Materials, 2005, pp. 470-471.

* cited by examiner

US 7,663,161 B2

TRANSISTOR FOR PREVENTING CURRENT COLLAPSE AND HAVING IMPROVED LEAKAGE CURRENT CHARACTERISTICS AND METHOD FOR FABRICATING THE SAME

BACKGROUND OF THE INVENTION (a) Fields of the Invention

The present invention relates to transistors with nitride semiconductors which are applicable to power transistors for use in, for example, power supply circuits of consumer devices such as general-purpose inverters.

(b) Description of Related Art

In recent years, field effect transistors (FETs) made of gallium nitride (GaN)-based materials have been actively studied as high-frequency, high-power devices. Since nitride semiconductor materials such as GaN can form various types of mixed crystals in combination with aluminum nitride (AlN) and indium nitride (InN), they can form heterojunctions like conventional arsenic-based semiconductor materials such as gallium arsenide (GaAs). In particular, the heterojunction of the nitride semiconductor is characterized in that by spontaneous polarization or piezoelectric polarization, carriers with a high concentration are generated at its heterointerface even without doping. As a result of this, in the case where a FET is fabricated from the nitride semiconductor material, the fabricated FET is likely to exhibit depletion type (normally-on type) characteristics, and hence it is difficult for the FET to exhibit enhancement-type (normally-off type) characteristics. However, most devices currently used in the power electronics market are normally-off type devices, so that normally-off type GaN-based nitride semiconductor devices are strongly demanded.

In order to realize normally-off type transistors, transistors having the following structures are studied. The structures include: the structure as described in "T. Kawasaki et al., Solid State Devices and Materials 2005 tech. digest p. 206" in which a gate portion is dug to shift a threshold voltage positively; the structure as described in "M. Kuroda et al., Solid State Devices and Materials 2005 tech. digest p. 470" in which a FET is fabricated on the GaN (11-20) plane, which is a so-called non-polar plane, to prevent a polarization electric field from being generated in the crystal growth direction of the nitride semiconductor. As shown in Japanese Unexamined Patent Publication No. 2005-244072, as a potential structure for realizing the normally-off type FET, a junction field effect transistor (JFET) is proposed in which a p-type GaN layer is formed in a gate portion. In the JFET structure, a barrier layer of AlGaN is formed on a channel layer of undoped GaN, and p-type GaN is formed on the barrier layer. In this structure, decreasing the thickness of the AlGaN layer or decreasing the Al content in the AlGaN layer can provide normally-off characteristics.

SUMMARY OF THE INVENTION

As shown above, various device structures are proposed toward attaining normally-off characteristics, and also prototypes of them are produced. In order to put them into practical use, however, a drain current decrease after application of a high voltage, that is, a so-called current collapse becomes a significant issue.

However, it is difficult to sufficiently prevent the current collapse in a normally-off type nitride semiconductor transistor. For example, if the transistor is employed as a switching transistor, the on-resistance thereof cannot be reduced to a sufficiently small value. Thus, there is a limit to a decrease in power loss.

In view of the issues described above, an object of the present invention is to provide a normally-off type transistor with current collapse prevented and its fabrication method.

To solve the above issues, the inventors of the present invention made the following study. This will be described with reference to the accompanying drawings.

First, a prototype of a nitride semiconductor transistor shown in FIG. 1 was produced as a first comparative example according to the present invention. FIG. 1 is a sectional view showing the structure of the normally-off type nitride semiconductor transistor with a JFET structure according to a first comparative example of the present invention. As shown in FIG. 1, the nitride semiconductor transistor of the first comparative example includes: a buffer layer 102 of AlN provided on a sapphire substrate 101; an undoped GaN layer 103 provided on the buffer layer 102; an undoped AlGaN layer 104 provided on the undoped GaN layer 103; a p-type GaN layer 105 provided on the undoped AlGaN layer 104; a gate electrode 108 of Pd or the like provided on the p-type GaN layer 105; and a source electrode 106 and a drain electrode 107 of Ti and Al provided on the undoped AlGaN layer 104 and at both sides of the gate electrode 108 as seen from a horizontal plane, respectively. In this specification, the word "undoped" indicates that no impurity is introduced intentionally. Note that Mg with a concentration of about $1 \times 10^{19}$ cm$^{-3}$ is doped into the p-type GaN layer 105. In this layer, however, the Mg concentration in the upper portion thereof (a region within a distance of about 10 nm from the top surface) is about $1 \times 10^{20}$ cm$^{-3}$, which is higher than the concentration in the other portion. The undoped AlGaN layer 104 is made of for example, $Al_{0.15}Ga_{0.85}N$.

When the transistor of the first comparative example shown in FIG. 1 is actually fabricated, it is found that unlike the conventional JFET, a drain voltage greatly increases in applying a positive voltage to the gate electrode 108. This is probably because holes injected from the gate electrode 108 generate electrons at the heterointerface and the generated electrons flow as a drain current. This phenomenon does not occur in general JFETs, and specific to GaN-based semiconductor materials of which the hole mobility is less significant than the electron mobility. Thus, the transistor of the first comparative example is also called a gate injection transistor. The transistor of the first comparative example has a device structure useful for application to a normally-off type power transistor. However, as a result of actual fabrication thereof, a phenomenon called current collapse in which a drain current decreases after application of a high drain voltage is observed.

FIG. 2 is a graph showing the relation between the drain voltage (Vds) and the drain current (Id) obtained in applying a pulse voltage to the nitride semiconductor transistor of the first comparative example. Note that the pulse voltage applied to the gate electrode 108 and the drain electrode 107 has a pulse width of 0.5 μsec and a pulse interval of 1 msec. As shown in FIG. 2, in the case where as a bias condition prior to application of a pulse voltage, the gate voltage is 0 V and the drain voltage is 60 V, application of a pulse voltage decreases the drain current relative to a low drain voltage and thus increases the on-resistance as compared with the case where the gate voltage is 0 V and the drain voltage is 0 V. This is the phenomenon called current collapse. Since the current collapse significantly increases the on-resistance, it causes a serious problem to a power transistor to which a high drain voltage is applied.

The mechanism of this current collapse will be described in detail using FIGS. 3 and 4. FIG. 3 is a sectional view showing expansion of a depletion layer when the transistor of the first comparative example is in an off-state. FIG. 4 is a sectional view showing expansion of a depletion layer in applying a drain voltage to the transistor of the first comparative example.

As shown in FIG. 3, since the transistor of the first comparative example is provided with the p-type GaN layer 105, the heterojunction between the undoped AlGaN layer 104 and the undoped GaN layer 103, which forms a channel, has a low carrier concentration. Therefore, the threshold voltage (the applied voltage necessary to form a channel) $V_{th1}$ applied below the gate electrode 108 can be increased to have a positive voltage value, for example, +0.5 V. In this condition, when the transistor is in the off-state (for example, when the gate voltage is in the state of 0 V or a negative voltage is applied thereto), the edge 305 of the depletion layer extends across the heterojunction. Therefore, the transistor of the first comparative example attains the normally-off characteristics. On the other hand, since the p-type GaN layer 105 is not provided in the portion located below the side of the gate electrode 108, the carrier concentration in the heterojunction between the undoped AlGaN layer 104 and the undoped GaN layer 103 is high. Therefore, the threshold voltage $V_{th2}$ of this portion can be decreased to have a value of a negative voltage, for example, −1 V.

In the above-shown transistor of the first comparative example, for example, when a drain voltage as high as about 60 V is applied and the transistor is set to an off-state (the gate electrode thereof is set at 0 V), it is conceivable that as shown in FIG. 4, application of a high drain voltage will expand the depletion layer (the edge 406 of the depletion layer in the off-state) created below the side of the gate electrode 108 to a larger area than the depletion layer (see the edge 305 of the depletion layer) shown in FIG. 3. Note that in the depletion layer created below the side of the gate electrode 108, the edge 406 in the off-state and the edge 407 in the on-state are present at the same position.

With a drain voltage of 60 V applied in the off-state described above, for example, the gate voltage is changed to a positive voltage (3 V). Immediately after the change, it is supposed that the depletion layer is affected by electrons 405 trapped in the surface states and is changed in the position of the depletion layer edge from the edge 406 in the off-state to the edge 407 in the on-state. That is to say, the electrons 405 trapped in the surface states slowly release, so that a phenomenon occurs in which a channel expands below the gate electrode 108 but does not expand below the side of the gate electrode 108 to inhibit an increase in drain current. This is the conceivable mechanism of the current collapse.

In order to solve the current collapse described above, the inventors of the present invention designed a transistor of a second comparative example of the present invention, which is shown in FIG. 5. FIG. 5 is a sectional view showing the structure of the transistor of the second comparative example of the present invention. Referring to FIG. 5, the transistor of the second comparative example is characterized in that a p-type AlGaN layer 505 is provided between the undoped AlGaN layer 104 and the p-type GaN layer 105. Since below the gate electrode 108, the p-type GaN layer 105 is provided like the transistor of the first comparative example, the threshold voltage $V_{th1}$ can be increased to have a value of a positive voltage, for example, +0.5 V. Therefore, the transistor of the second comparative example realizes normally-off characteristics. On the other hand, the p-type AlGaN layer 505 is provided also below the side of the gate electrode 108. By this structure, the threshold voltage $V_{th2}$ of this portion can have a value of, for example, −2 V, that is, can have a lower value than the transistor of the first comparative example. Therefore, the difference between $V_{th1}$ and $V_{th2}$, that is, the threshold voltage difference ($\Delta V_{th} = V_{th1} - V_{th2}$) is 2.5 V, which is greater than $\Delta V_{th}$ (1.5 V) in the first comparative example.

FIG. 6 is a sectional view showing expansion of a depletion layer in applying a drain voltage to the transistor of the second comparative example of the present invention. In the transistor of the second comparative example, the transistor is set to an off-state with a drain voltage as high as about 60 V applied thereto. In this case, as shown in FIG. 6, the threshold voltage difference $\Delta V_{th}$ described above is set to have an increased value, so that below the side of the gate electrode 108, the depletion layer (the edge 607 of the depletion layer in the off-state) expands only to the location where a channel opens. With a drain voltage applied in this state, when a positive voltage (3 V) is applied to the gate to turn into an on-state, a depletion layer (the edge 608 of the depletion layer in the on-state) created below the side of the gate electrode 108 is affected by electrons trapped in the surface states. Therefore, this depletion layer is still kept in the state in which it expands, without changing from the off-state, to the location where a channel opens. In this condition, the state of the drain current is determined by the location of the depletion layer created below the gate electrode 108. Therefore, in the transistor of the second comparative example, a sufficient drain current can be observed even after application of a high voltage thereto. Accordingly, with the transistor of the second comparative example, current collapse can be prevented. As is apparent from the above, a conceivable important point to prevent the current collapse is that the threshold voltage below the side of the gate electrode 108 is made small enough to have a vale of a completely negative voltage.

Subsequently, the threshold voltage difference ($\Delta V_{th}$) described above was studied by changing the thicknesses of the p-type AlGaN layer 505 and the undoped AlGaN layer 104 in the transistor of the second comparative example. FIG. 7 is a graph showing the threshold voltage difference ($\Delta V_{th}$) and the drain current ratio in applying a pulse voltage. In FIG. 7, the drain current used for the drain current ratio is measured in the case of a drain voltage of 10 V and a gate voltage of 5 V in applying a pulse voltage, and the drain current ratio obtained represents the ratio between the drain currents in the cases of drain voltages of 0 V and 60 V immediately before pulse voltage application. Therefore, this ratio indicates the fact that the current collapse is prevented more reliably as it approaches one and conversely the current collapse occurs more significantly as it approaches zero. As shown in FIG. 7, it is found that there is a direct correlation between $\Delta V_{th}$ and the drain current ratio and the current collapse is prevented more reliably as $\Delta V_{th}$ is greater. In particular, when $\Delta V_{th}$ is 2.5 V or higher, the drain current ratio becomes approximately one and thus the current collapse is completely prevented.

FIG. 8 is a graph showing the relation between the drain voltage (Vds) and the drain current (Id) in applying a pulse voltage to the transistor of the second comparative example. As shown in FIG. 8, for the transistor of the second comparative example, even in the case where a high drain voltage (60 V) is applied immediately before pulse voltage application, the transistor exhibits almost the same characteristics as those in the case of a drain voltage of 0 V immediately before pulse voltage application. From this, it is found that the current collapse is prevented.

The structure of the transistor of the second comparative example, however, causes a problem as shown in FIG. 9. FIG. 9 is a graph showing the leakage current in the transistors of the first and second comparative examples. As shown in FIG. 9, for the transistor of the second comparative example, the leakage current flowing between the source and drain electrodes in an off-state is larger than that of the transistor of the first comparative example. This is probably because a leakage path is created through the p-type AlGaN layer additionally provided in the transistor of the second comparative example.

From a thorough study of the above-mentioned mechanism of the current collapse, the inventors of the present invention found out that a transistor and its fabrication method to be described below can be employed to solve the above problem.

A transistor according to the present invention includes: a substrate; a first semiconductor layer formed over the substrate; a second semiconductor layer provided on the first semiconductor layer, having a channel formed by heterojunction at the interface with the first semiconductor layer, and having a first region and a second region; a first p-type semiconductor layer formed on a region of the second semiconductor layer other than the first region and the second region; a second p-type semiconductor layer formed on the first p-type semiconductor layer; a gate electrode formed on the second p-type semiconductor layer; and a source electrode and a drain electrode formed on or above the first semiconductor layer and at both sides of the gate electrode as seen from a horizontal plane, respectively, and the first region is provided between the gate electrode and the drain electrode as seen from a horizontal plane, and the second region is provided between the gate electrode and the source electrode as seen from a horizontal plane.

With the structure of this transistor, the first p-type semiconductor layer is formed between the second semiconductor layer and the second p-type semiconductor layer, and provided so that the first region and the second region are interposed between the layer and the drain electrode and the source electrode in order not to come into contact with the electrodes. Thus, like the transistor of the second comparative example described above, the first p-type semiconductor layer can be provided to widen the difference between the threshold voltage $V_{th1}$ below the gate electrode and the threshold voltage $V_{th2}$ below the side of the gate electrode, so that the transistor can resist the influence of the surface states. This leads to prevention of the current collapse. Moreover, the first p-type semiconductor layer is provided not to come into contact with the source electrode and the drain electrode. Thus, a leakage current can be decreased as compared with the transistor of the second comparative example described above. Accordingly, with the transistor according to the present invention, a normally-off type transistor can be provided which prevents the current collapse and has a decreased leakage current.

The first p-type semiconductor layer may be made of $Al_xGa_{1-x}N$ ($0 \leq x \leq 1$), and the second p-type semiconductor layer may be made of $Al_yGa_{1-y}N$ ($0 \leq y \leq 1$). In this case, the lattice constants of the first and second p-type semiconductor layers approach the lattice constants of the first and second semiconductor layers provided for forming a channel structure. Therefore, above the first and second semiconductor layers, the first and second p-type semiconductor layers can be formed with crystal defects prevented from occurring.

Desirably, the first p-type semiconductor layer is made of $Al_xGa_{1-x}N$ ($0 \leq x \leq 1$), the second p-type semiconductor layer is made of $Al_yGa_{1-y}N$ ($0 \leq y \leq 1$), and the layers satisfy $x \geq y$. In this case, as in the case described above, the lattice constant of the first p-type semiconductor layer approaches the lattice constants of the first and second semiconductor layers, so that the first p-type semiconductor layer can be grown with crystal defects prevented from occurring. Moreover, since the Al concentration in the second p-type semiconductor layer is lower than that of the first p-type semiconductor layer, the threshold voltage $V_{th1}$ below the gate electrode can be made higher. This is effective at providing a normally-off type transistor.

The case where the first region has a width in the gate length direction of 0.7 to 4.5 μm inclusive is preferable because reduction of leakage current and prevention of current collapse can be conducted more effectively.

Next, a method for fabricating a transistor according to the present invention includes: the step (a) of epitaxially growing, sequentially over a substrate, a first semiconductor layer, a second semiconductor layer having a first region and a second region, a first p-type semiconductor layer, and a second p-type semiconductor layer having a gate electrode formation region; the step (b) of selectively removing the second p-type semiconductor layer to leave the gate electrode formation region; the step (c) of selectively removing the first p-type semiconductor layer to leave a portion thereof provided on a region between the first and second regions as seen from a horizontal plane; the step (d) of selectively removing, after the step (c), an upper portion of the first semiconductor layer and the second semiconductor layer to form recesses at respective sides of the first and second regions as seen from a horizontal plane, the recesses exposing the first semiconductor layer; the step (e) of filling the recesses with metal to form a source electrode at the side of the second region and a drain electrode at the side of the first region; and the step (f) of forming a gate electrode on the second p-type semiconductor layer.

This method is characterized in that in the step (c), a portion of the first p-type semiconductor layer is removed to leave a predetermined region (a region between the first and second regions as seen from a horizontal plane), and in the step (d), the recesses for providing the source electrode and the drain electrode are formed at the sides of the first and second regions, respectively. Thereby, a groove with a bottom composed of the first region is formed between the drain electrode and the first p-type semiconductor layer, and a groove with a bottom composed of the second region is formed between the source electrode and the first p-type semiconductor layer. As a result of this, the first p-type semiconductor layer capable of reducing the influence of the surface states can be provided on the second semiconductor layer, and the source electrode and the drain electrode can be electrically isolated from the first p-type semiconductor layer. Accordingly, with the method for fabricating a transistor according to the present invention, a normally-off type transistor can be fabricated which prevents the current collapse and has a decreased leakage current.

DETAILED DESCRIPTION OF THE PREFERRED EMBODIMENTS

Embodiment

Figure 10:
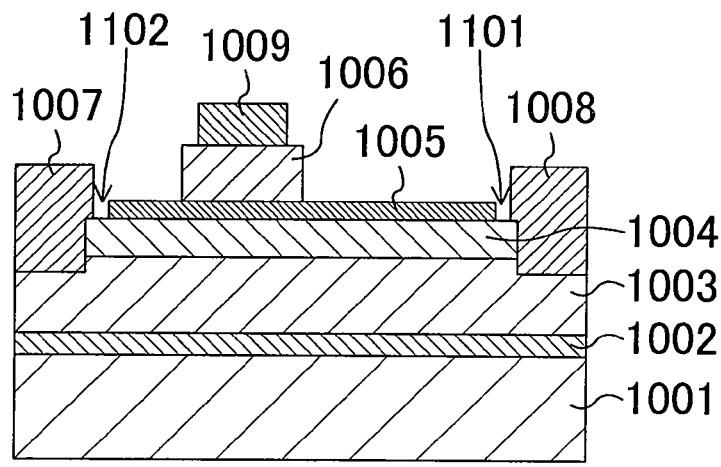
FIG. 10 is a sectional view showing the structure of a first transistor according to an embodiment of the present invention.

Hereinafter, a nitride semiconductor transistor (a first transistor) with a JFET structure and its fabrication method according to an embodiment of the present invention will be described with reference to the accompanying drawings. FIG. 10 is a sectional view showing the structure of the first transistor according to this embodiment.

Referring to FIG. 10, the first transistor according to this embodiment includes a substrate 1001, a buffer layer 1002, a first semiconductor layer 1003, a second semiconductor layer 1004, a first p-type semiconductor layer 1005, and a second p-type semiconductor layer 1006. The substrate 1001 of sapphire has the (0001) plane used as a principal plane. The buffer layer 1002 of AlN or the like is formed on the principal plane of the substrate 1001 and has a thickness of 100 nm. The first semiconductor layer 1003 of undoped GaN is formed on the buffer layer 1002, and has a thickness of 2 μm. The second semiconductor layer 1004 of undoped AlGaN or the like is formed on the first semiconductor layer 1003, and has a thickness of 25 nm. The first p-type semiconductor layer 1005 of AlGaN or the like is formed on a portion of the second semiconductor layer 1004, and has a thickness of 15 nm. The second p-type semiconductor layer 1006 of GaN or the like is formed on the first p-type semiconductor layer 1005, and has a thickness of 100 nm. The second semiconductor layer 1004 and the first p-type semiconductor layer 1005 are each made of, for example, $Al_{0.15}Ga_{0.85}N$.

Furthermore, the first transistor according to this embodiment includes a gate electrode 1009, a source electrode 1007, and a drain electrode 1008. The gate electrode 1009 of Pd or the like is formed on the second p-type semiconductor layer 1006 to come into an ohmic contact. The source electrode 1007 and the drain electrode 1008 of, for example, Ti and Al are formed at both sides of the gate electrode 1009 as seen from a horizontal plane, respectively, and penetrate the second semiconductor layer 1004 to come into contact with the upper portion of the first semiconductor layer 1003. In the first p-type semiconductor layer 1005, for example, Mg with a concentration of about $1 \times 10^{19}$ $cm^{-3}$ is doped into the AlGaN layer, and thus the carrier concentration of the layer is about $1 \times 10^{18}$ $cm^{-3}$. Most part of the second p-type semiconductor layer 1006 has a carrier concentration almost the same as that of the first p-type semiconductor layer 1005, but into a region thereof located from the top surface up to a distance of about 10 nM, Mg with a concentration of about $1 \times 10^{20}$ $cm^{-3}$ is doped. At the interface between the first semiconductor layer 1003 and the second semiconductor layer 1004, a channel is produced by heterojunction therebetween. In the transistor of this embodiment, the source electrode 1007 and the drain electrode 1008 are formed to be embedded in the upper portion of the first semiconductor layer 1003 and the second semiconductor layer 1004. However, the structure of them is not limited to this, and they may be provided on or above the first semiconductor layer 1003.

In this construction, a region of the second semiconductor layer 1004 located close to the drain electrode 1008 and formed with no first p-type semiconductor layer 1005 is represented as a first region, and a region thereof located close to the source electrode 1007 and formed with no first p-type semiconductor layer 1005 is represented as a second region.

In the first transistor of this embodiment, the second p-type semiconductor layer 1006 of a GaN layer or the like is provided like the transistor of the second comparative example. Thus, the threshold voltage $V_{th1}$ below the gate electrode 1009 can be increased to have a value of a positive voltage, and thereby the first transistor realizes normally-off characteristics.

The transistor of this embodiment is characterized in that the first p-type semiconductor layer 1005 is provided between the second semiconductor layer 1004 and the second p-type semiconductor layer 1006, and that the first p-type semiconductor layer 1005 is provided with a first groove 1101 (a groove having a bottom composed of the first region) and a second groove 1102 (a groove having a bottom composed of the second region) interposed between the layer and the drain and source electrodes 1008 and 1007, respectively, in order not to come into contact with the electrodes. With this structure, since the first p-type semiconductor layer 1005 is provided like the transistor of the second comparative example described above, the difference between the threshold voltage $V_{th1}$ below the gate electrode 1009 and the threshold voltage $V_{th2}$ below the side of the gate electrode 1009 (the threshold voltage difference $\Delta V_{th}$) can be widened. Therefore, the transistor can resist the influence of the surface states, which leads to prevention of current collapse. Moreover, since the first p-type semiconductor layer 1005 is spaced apart from the source electrode 1007 and the drain electrode 1008 with the respective grooves interposed therebetween, a leakage current can be decreased as compared with the transistor of the second comparative example described above. Accordingly, with the first transistor of this embodiment, a normally-off type transistor can be provided which prevents the current collapse and has a decreased leakage current.

Figure 1:
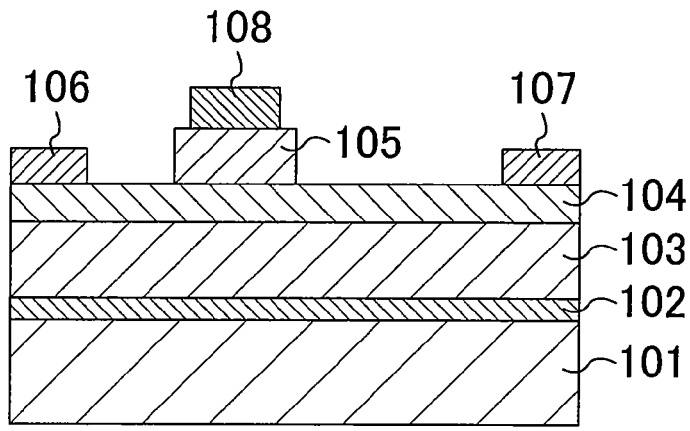
FIG. 1 is a sectional view showing the structure of a transistor according to a first comparative example of the present invention.
Figure 2:
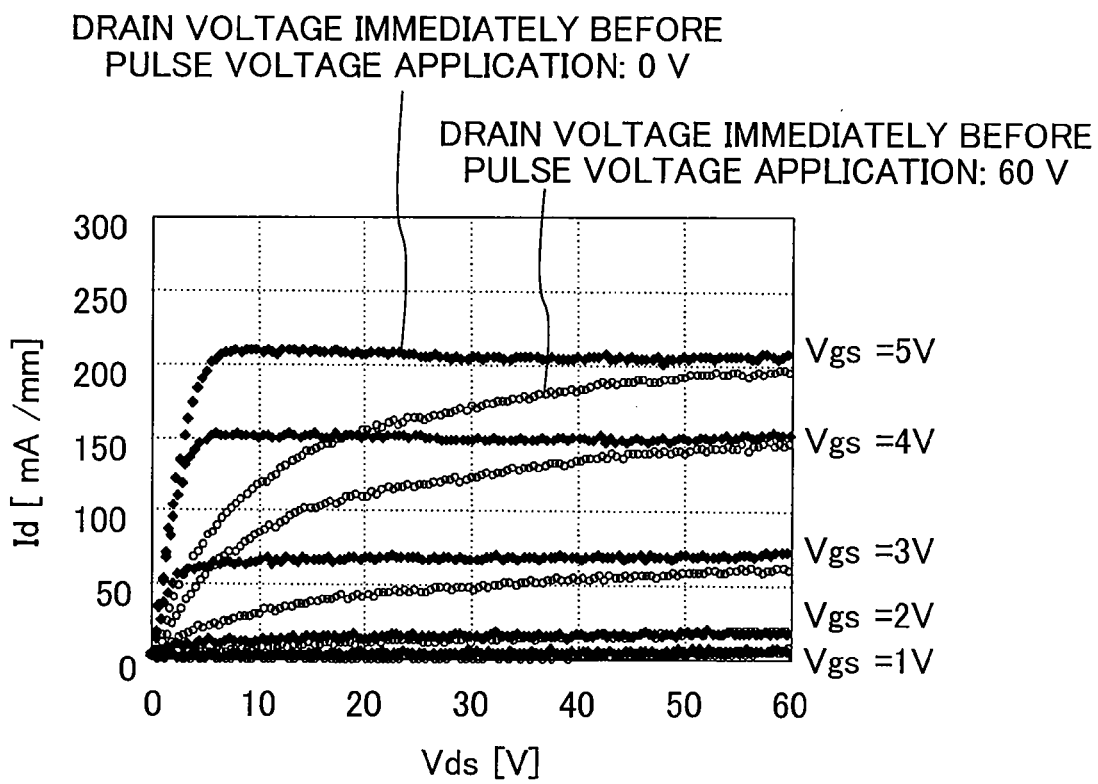
FIG. 2 is a graph showing the relation between the drain voltage and the drain current obtained in applying a pulse voltage to the transistor of the first comparative example.
Figure 3:
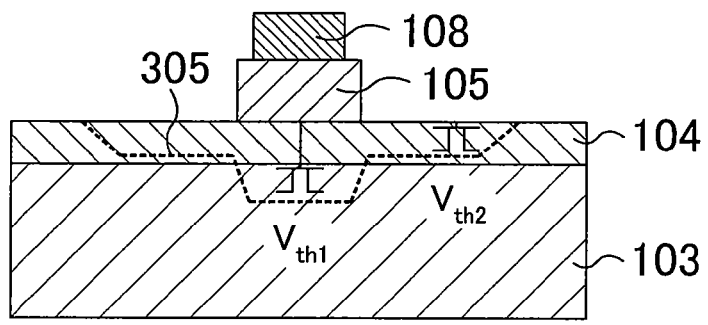
FIG. 3 is a view showing expansion of a depletion layer when the transistor of the first comparative example is in an off-state.
Figure 4:
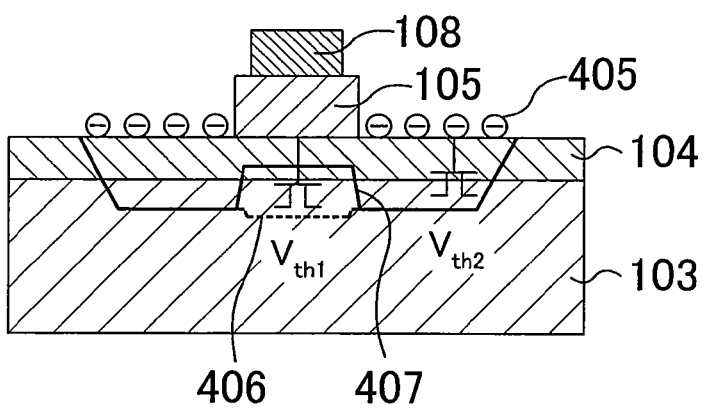
FIG. 4 is a view showing expansion of a depletion layer in applying a drain voltage to the transistor of the first comparative example.
Figure 5:
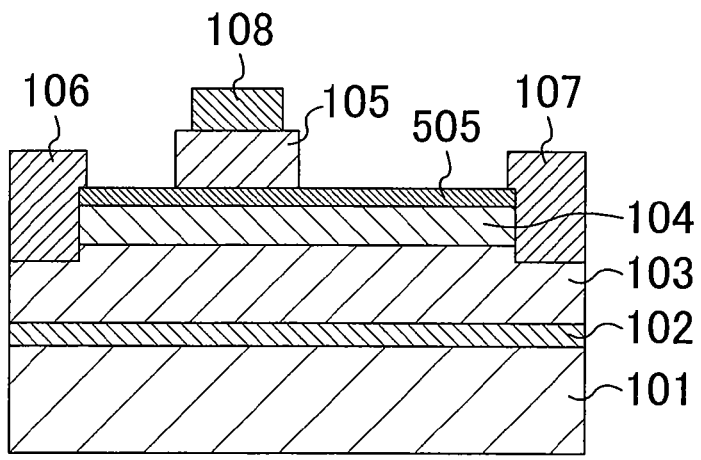
FIG. 5 is a sectional view showing the structure of a transistor according to a second comparative example of the present invention.
Figure 6:
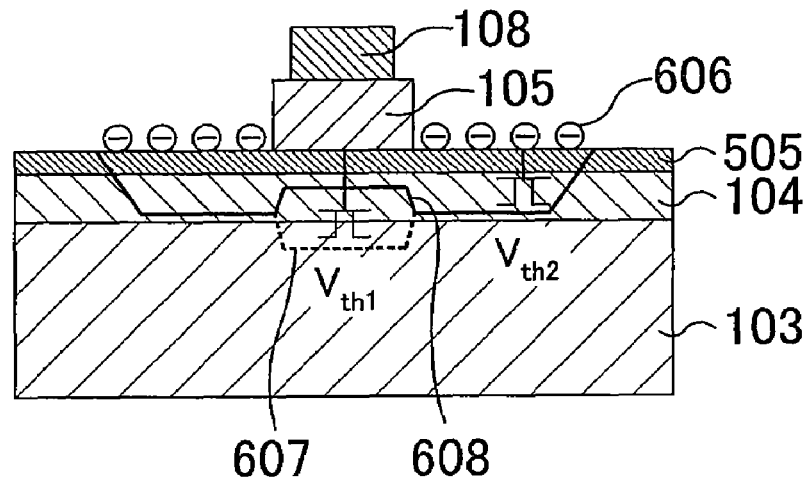
FIG. 6 is a view showing expansion of a depletion layer in applying a drain voltage to the transistor of the second comparative example.
Figure 7:
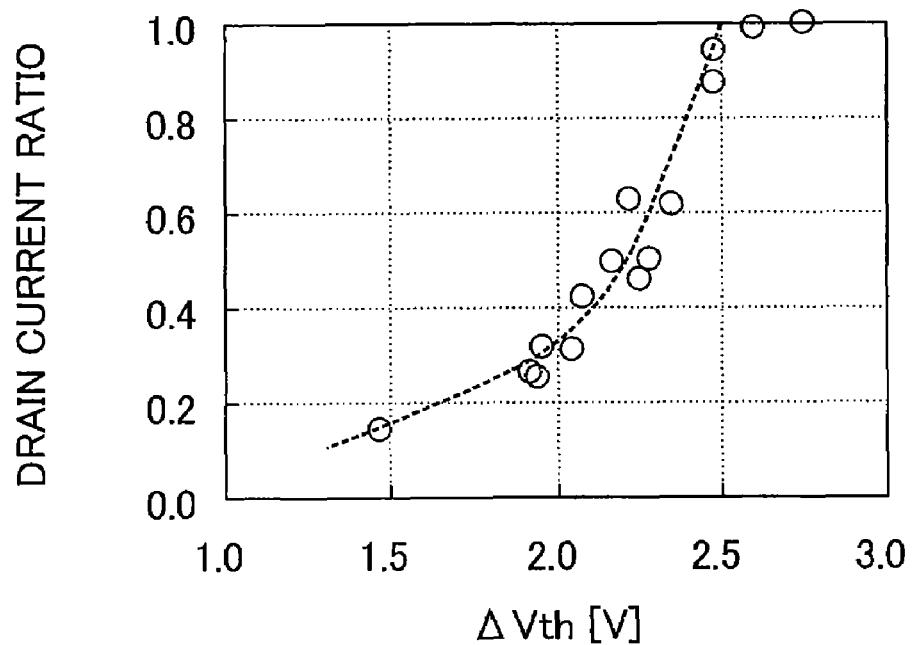
FIG. 7 is a graph showing the threshold voltage difference and the drain current ratio in applying a pulse voltage in the transistor of the second comparative example.
Figure 8:
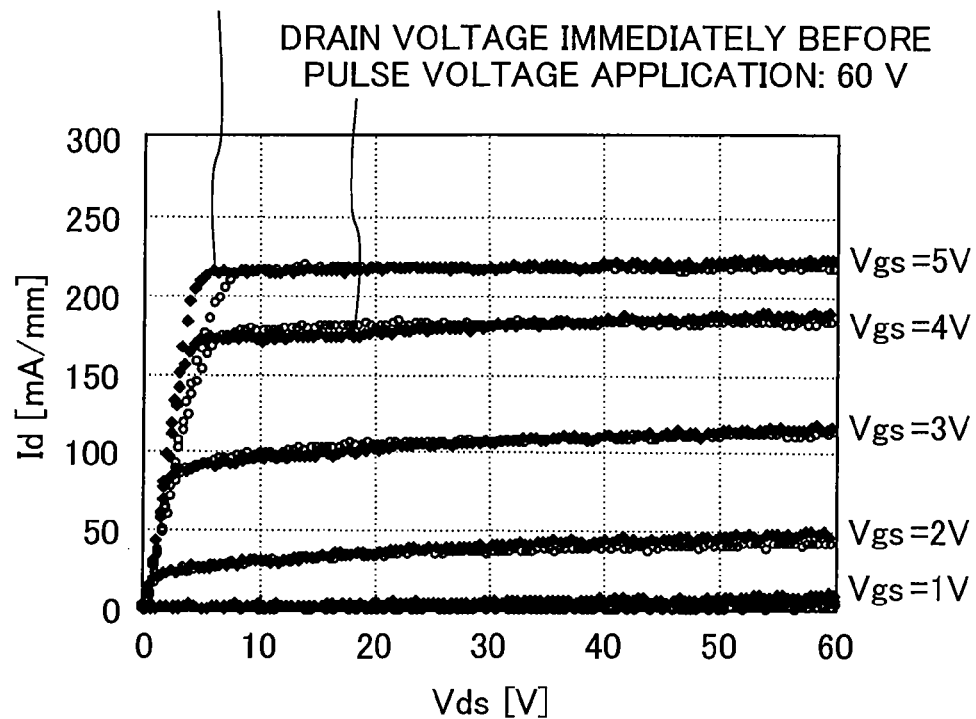
FIG. 8 is a graph showing the relation between the drain voltage and the drain current in applying a pulse voltage to the transistor of the second comparative example.
Figure 9:
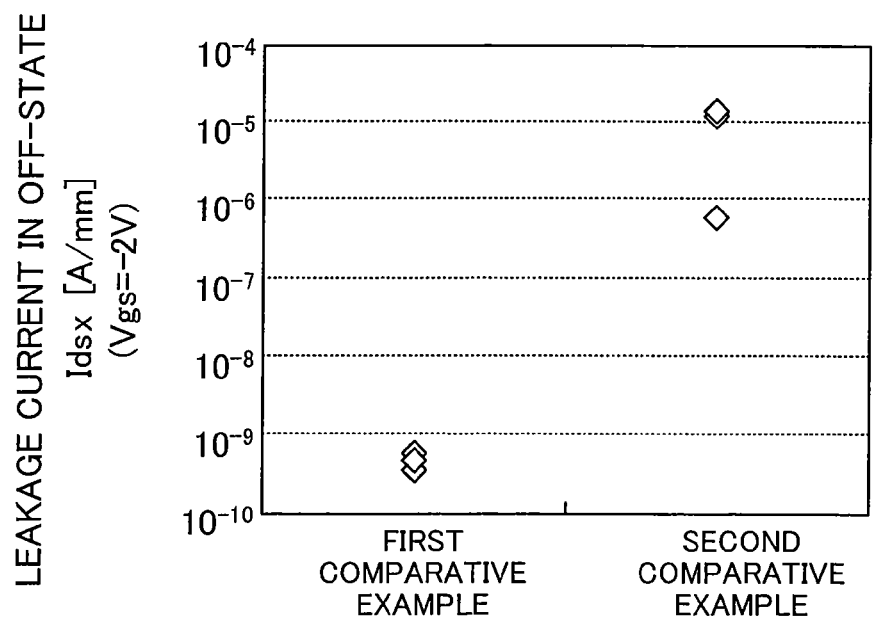
FIG. 9 is a graph showing the leakage current in the transistors of the first and second comparative examples.
Figure 11:
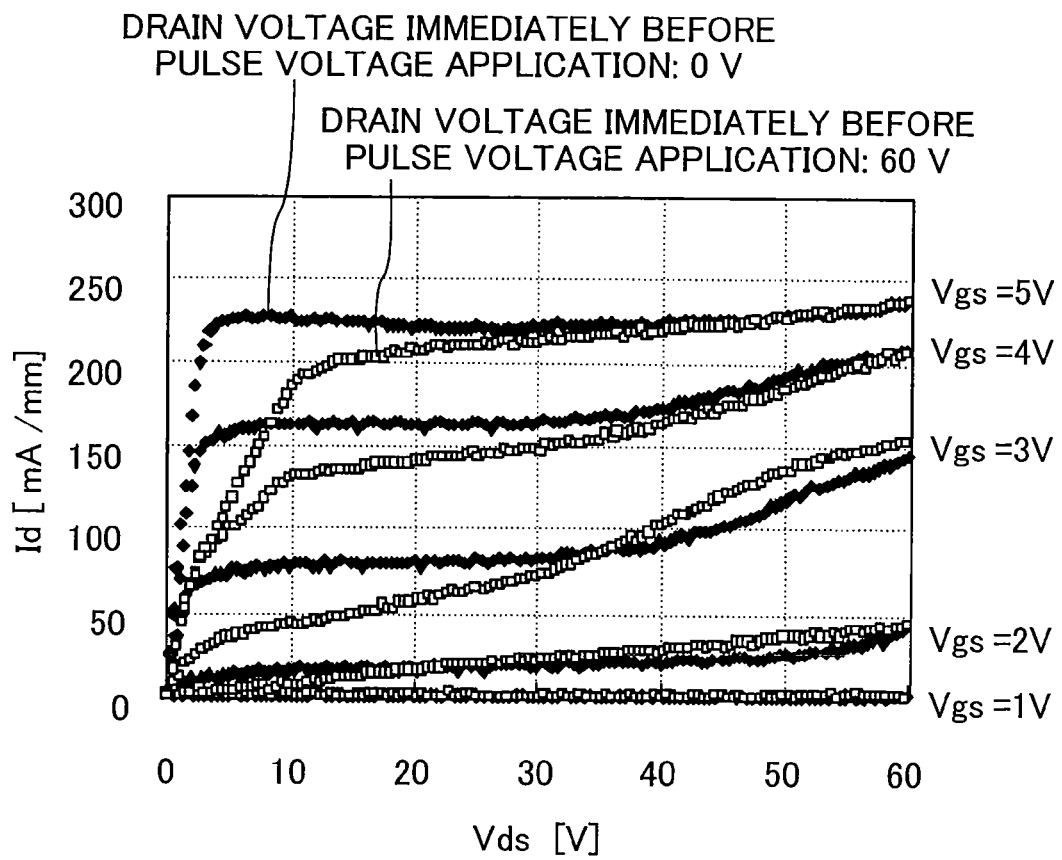
FIG. 11 is a graph showing the relation between the drain voltage and the drain current in applying a pulse voltage to the first transistor.

FIG. 11 is a graph showing the relation between the drain voltage (Vds) and the drain current (Id) in applying a pulse voltage to the first transistor. As shown in FIG. 11, for the first transistor, even in the case where a high drain voltage (60 V) is applied thereto immediately before pulse voltage application, it has a current value closer to that measured in the case of a drain voltage of 0 V than the characteristics of the transistor of the first comparative example (see FIG. 2). From this, it is found that the current collapse is prevented.

In the first transistor, the second p-type semiconductor layer 1006 and the gate electrode 1009 are deviated to the side of the source electrode 1007. This increases the distance between the gate electrode 1009 and the drain electrode 1008, so that an electric field produced in applying a high drain voltage can be relieved to improve the breakdown voltage of the transistor.

Next, a fabrication method of the first transistor according to this embodiment will be described using FIGS. 12A to 12F. FIGS. 12A to 12F are sectional views showing the fabrication method of the first transistor.

Figure 12A:
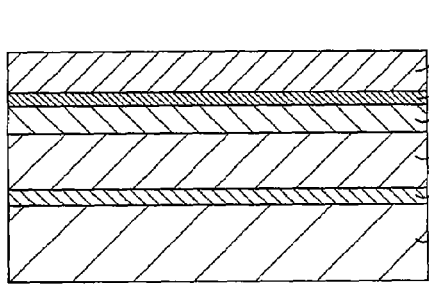
FIGS. 12A to 12F are sectional views showing a fabrication method of the first transistor.

Referring to FIG. 12A, first, on the substrate 1001 of sapphire or the like, the buffer layer 1002 of AlN or the like with a thickness of 100 nm, the first semiconductor layer 1003 of undoped GaN or the like with a thickness of 2 μm, the second semiconductor layer 1004 of undoped AlGaN or the like with a thickness of 25 nm, the first p-type semiconductor layer 1005 of AlGaN or the like with a thickness of 15 nm, and the second p-type semiconductor layer 1006 of GaN or the like with a thickness of 100 nm are epitaxially grown sequentially by a MOCVD (Metal Organic Chemical Vapor Deposition) method.

Figure 12D:
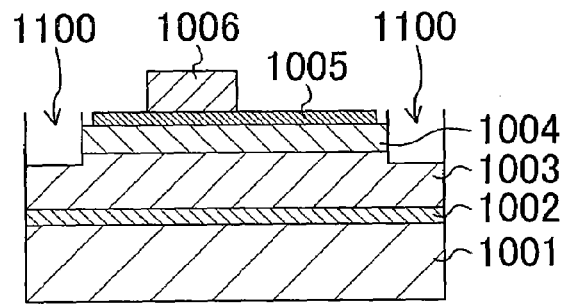
Figure 12B:
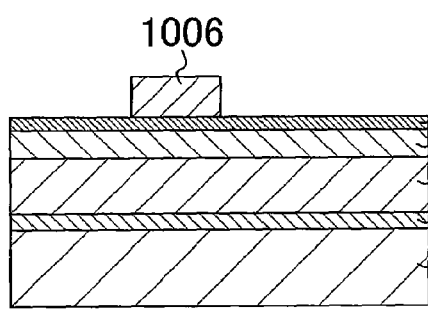

Next, as shown in FIG. 12B, by dry etching, the second p-type semiconductor layer 1006 is selectively removed to leave a region to be formed with the gate electrode in a later step (referred hereinafter to as "a gate electrode formation region"). Then, as shown in FIG. 12C, by dry etching, the first p-type semiconductor layer 1005 is selectively removed to leave a predetermined region. In this step, the resulting first p-type semiconductor layer 1005 is formed on a region of the second semiconductor layer 1004 located between the first region and the second region as seen from a horizontal plane, respectively.

Subsequently, as shown in FIG. 12D, the upper portion of the first semiconductor layer 1003 and the second semiconductor layer 1004 are selectively removed by etching to form recesses exposing the first semiconductor layer 1003 at the both sides of the first p-type semiconductor layer 1005 as seen from a horizontal plane.

Figure 12E:
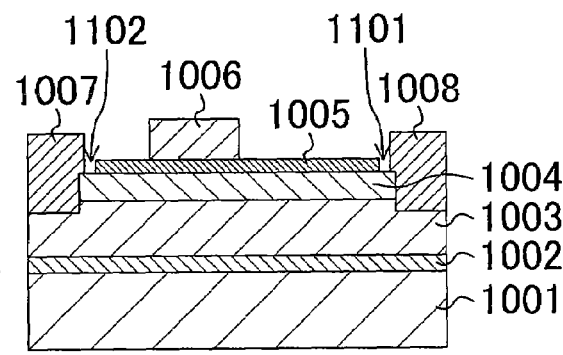
Figure 12C:
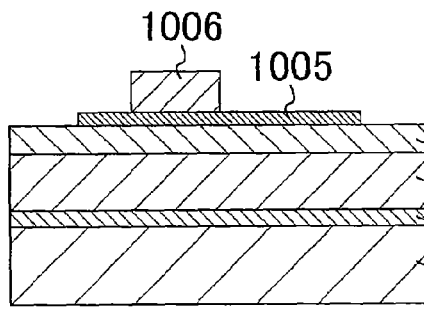

As shown in FIG. 12E, the recesses formed in the previous step are filled with, for example, Ti and Al to form the source electrode 1007 and the drain electrode 1008, respectively. In this step, the first p-type semiconductor layer 1005 is separated from the drain electrode 1008 by the first groove 1101 with the bottom composed of the first region, and also separated from the source electrode 1007 by the second groove 1102 with the bottom composed of the second region.

Figure 12F:
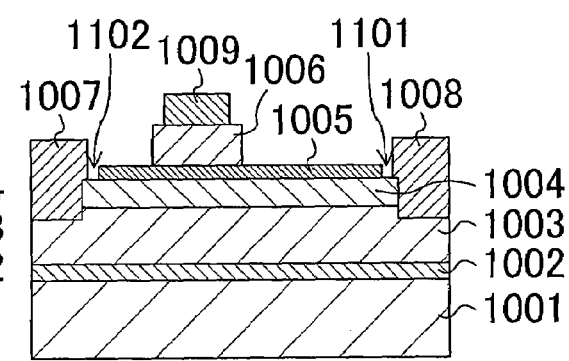

Finally, as shown in FIG. 12F, the gate electrode 1009 of Pd or the like is formed on the gate electrode formation region of the second p-type semiconductor layer 1006. Through predetermined processes subsequent to this step, the first transistor of this embodiment can be fabricated.

The formation method of the first transistor according to this embodiment is characterized in that in the step shown in FIG. 12C, the first p-type semiconductor layer 1005 is formed to leave the predetermined region (the region between the first region and the second region as seen from a horizontal plane), and then in the step shown in FIG. 12D, the recesses for forming the source electrode 1007 and the drain electrode 1008 are formed at the respective sides of the first region and the second region. Thereby, the first groove 1101 is formed between the drain electrode 1008 and the first p-type semiconductor layer 1005, and the second groove 1102 is formed between the source electrode 1007 and the first p-type semiconductor layer 1005. As a result of this, the first p-type semiconductor layer 1005 capable of reducing the influence of the surface states can be provided on the second semiconductor layer 1004, and the source electrode 1007 and the drain electrode 1008 can be electrically isolated from the first p-type semiconductor layer 1005. Accordingly, with the fabrication method of the first transistor of this embodiment, a normally-off type transistor can be fabricated which prevents the current collapse and has a decreased leakage current.

Figure 13:
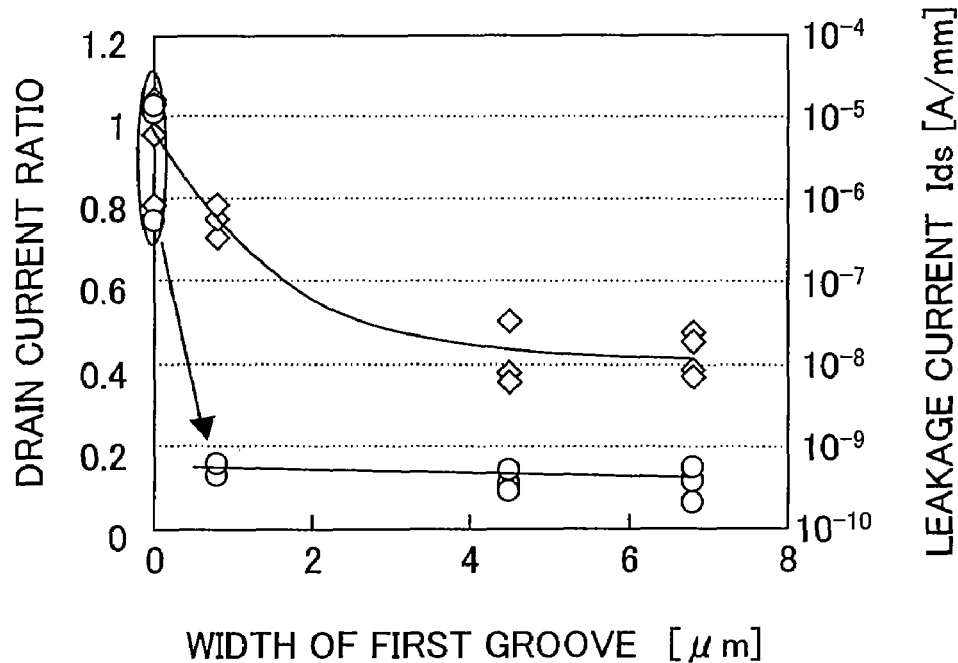
FIG. 13 is a graph showing the drain current ratio and the leakage current relative to the width of a first groove.

Preferably, the first groove 1101 (the first region) provided between the drain electrode 1008 and the first p-type semiconductor layer 1005 has a width in the gate length direction of 0.7 to 4.5 μm inclusive. FIG. 13 is a graph showing the drain current ratio and the leakage current relative to the width of the first groove 1101. In FIG. 13, the drain current used for the drain current ratio is measured in the case of a drain voltage of 10 V and a gate voltage of 5 V in applying a pulse voltage, and the drain current ratio obtained represents the ratio of the drain current in the case of a drain voltage of 60 V immediately before pulse voltage application to the drain current in the case of a drain voltage of 0 V immediately before pulse voltage application. Therefore, this ratio indicates the fact that as the drain current ratio approaches one, the current collapse is prevented more reliably. As the leakage current between the source electrode and the drain electrode, used is made of the drain current in an off-state in the case of a drain voltage of 20 V and a gate voltage of −2 V. Note that in the first transistor, the distance between the gate electrode 1009 and the drain electrode 1008 is 7.5 μm. As shown in FIG. 13, the drain current ratio gradually decreases with an increase in the width of the first groove. When the width of the first groove is 0.7 μm, the drain current ratio is about 0.8. From this, it is found that the current collapse is sufficiently prevented. On the other hand, the leakage current has a great value only when the width of the first groove is 0 μm, that is, only when the first p-type semiconductor layer 1005 and the drain electrode 1008 are in contact with each other. In addition, a width of the first groove of 0.7 μm or more provides a leakage current of $1 \times 10^{-8}$ [A/mm] or less, so that the leakage current is significantly reduced. As is apparent from the above, in the first transistor of this embodiment, the width of the first region can be set at 0.7 to 4.5 μm inclusive to more effectively reduce the leakage current and prevent the current collapse. Note that the width of the first groove is not limited to the range mentioned above. Even though it is less than 0.7 μm, reduction of the leakage current and prevention of the current collapse can be attained as long as the first p-type semiconductor layer 1005 is not contact with the source electrode 1007 and the drain electrode 1008.

Figure 14:
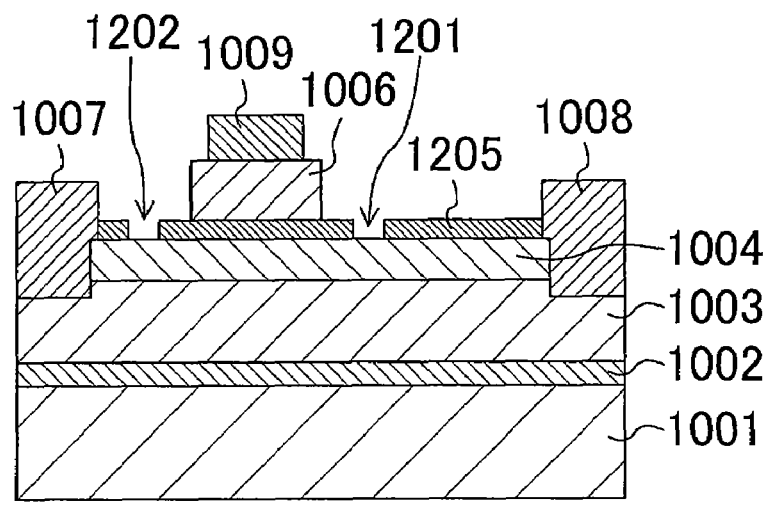
FIG. 14 is a sectional view showing the structure of a second transistor according to this embodiment.

Next, a second transistor shown in FIG. 14 will be described as one modification of the first transistor of this embodiment. FIG. 14 is a sectional view showing the structure of the second transistor according to this embodiment. The second transistor differs from the first transistor only in the structure of a first p-type semiconductor layer 1205, and hence description of like components thereof will be omitted.

Referring to FIG. 14, in the second transistor of this embodiment, the first p-type semiconductor layer 1205 has: a third groove 1201 with a bottom composed of a first region; and a fourth groove 1202 with a bottom composed of a second region. The first p-type semiconductor layer 1205 is separated by the third groove 1201 and the fourth groove 1202 into: a first portion in contact with the source electrode 1007; a second portion provided below the gate electrode 1009; and a third portion in contact with the drain electrode 1008.

With the above structure, the first p-type semiconductor layer 1205 is electrically isolated from the source electrode 1007 and the drain electrode 1008. Thus, like the first transistor described above, the second transistor can also attain reduction of the leakage current and prevention of the current collapse.

The second transistor can be fabricated by fabrication processes in which some of the first transistor fabrication processes shown above (see FIG. 12) are modified. To be more specific, when the first p-type semiconductor layer 1205 is etched in the step shown in FIG. 12C, the third groove 1201 exposing the first region and the fourth groove 1202 exposing the second region are formed at the both sides of the second p-type semiconductor layer 1006, respectively, as seen from a horizontal plane. Thereafter, in the step shown in FIG. 12D, the upper portion of the first semiconductor layer 1003, the second semiconductor layer 1004, and portions of the first p-type semiconductor layer 1005 located at respective sides of the third groove 1201 and the fourth groove 1202 are selectively removed. Through the processes described above, the second transistor can be fabricated in a similar manner to the first transistor.

Figure 15:
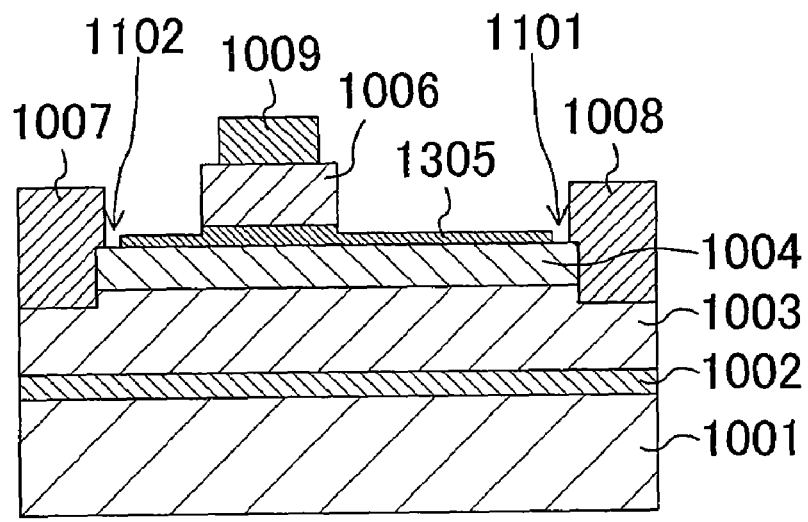
FIG. 15 is a sectional view showing the structure of a third transistor according to this embodiment.

Subsequently, a third transistor shown in FIG. 15 will be described as one modification of the first transistor of this embodiment. FIG. 15 is a sectional view showing the structure of the third transistor according to this embodiment. The third transistor differs from the first transistor only in the structure of a first p-type semiconductor layer 1305, and hence description of like components thereof will be omitted.

Referring to FIG. 15, in the third transistor of this embodiment, the first p-type semiconductor layer 1305 is provided to have a convex shape, and a portion thereof in contact with the second p-type semiconductor layer 1006 has a greater thickness than the other portion. The portion thereof in contact with the second p-type semiconductor layer 1006 has a thickness of, for example, 20 nm, and the portion thereof formed at the side of the second p-type semiconductor layer 1006 as seen from a horizontal plane has a thickness of, for example, 15 nm. Also with such structure, the same effects as the first transistor described above can be provided.

The third transistor can be fabricated by fabrication processes in which some of the first transistor fabrication processes shown above (see FIG. 12) are modified. To be more specific, the second p-type semiconductor layer 1006 is selectively removed in the step shown in FIG. 12B, and then using the second p-type semiconductor layer 1006 as a mask, the first p-type semiconductor layer 1005 is removed by, for example, 5 nm by dry etching. Thereafter, the portions of the first p-type semiconductor layer 1005 located at the sides of the first region and the second region are selectively removed to leave the first p-type semiconductor layer 1005 formed between the first region and the second region as seen from a horizontal plane. Through the processes described above, the first p-type semiconductor layer 1005 can be formed in a convex shape.

Figure 16:
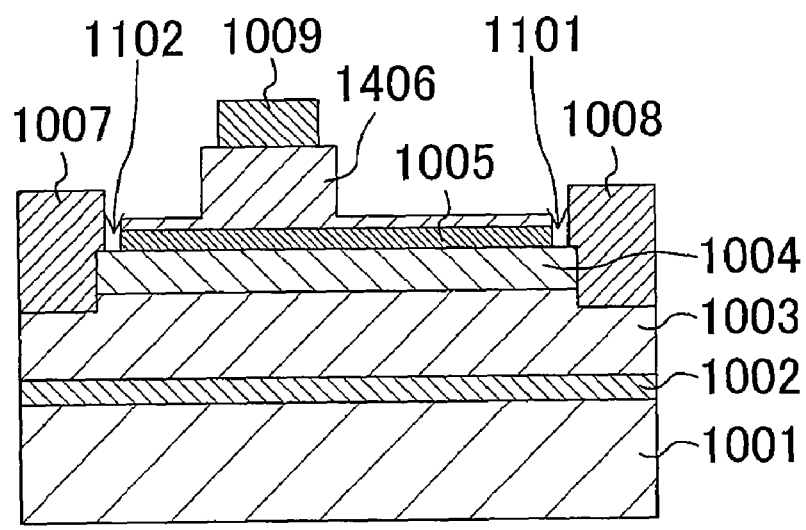
FIG. 16 is a sectional view showing the structure of a fourth transistor according to this embodiment.

Finally, a fourth transistor shown in FIG. 16 will be described as one modification of the first transistor of this embodiment. FIG. 16 is a sectional view showing the structure of the fourth transistor according to this embodiment. The fourth transistor differs from the first transistor only in the structure of a second p-type semiconductor layer 1406, and hence description of like components thereof will be omitted.

Referring to FIG. 16, in the fourth transistor of this embodiment, the second p-type semiconductor layer 1406 in a convex shape is provided on the first p-type semiconductor layer 1005, and a portion of the second p-type semiconductor layer 1406 formed below the gate electrode 1009 has a greater thickness than the other portion. Also with the fourth transistor having such a structure, the leakage current can be decreased as in the case of the first transistor, and the current collapse can be prevented. Note that if a portion of the second p-type semiconductor layer 1406 formed below the side of the gate electrode 1009 as seen from a horizontal plane has a great thickness, the threshold voltage difference $\Delta V_{th}$ mentioned above cannot be widened. Therefore, the thickness of this portion is preferably 20 μm or smaller.

The fourth transistor can be fabricated by fabrication processes in which some of the first transistor fabrication processes shown above (see FIG. 12) are modified. To be more specific, in the step shown in FIG. 12A, the second p-type semiconductor layer 1406 with a thickness of, for example, 100 nm is formed on the first p-type semiconductor layer 1005, and then in the step shown in FIG. 12B, the portion of the second p-type semiconductor layer other than the gate electrode formation region is selectively removed by, for example, 80 nm to leave the portion of the second p-type semiconductor layer 1406 provided in the gate electrode formation region. Thereafter, in the step shown in FIG. 12C, the first p-type semiconductor layer 1005 and the second p-type semiconductor layer 1406 are selectively removed to leave portions of the first p-type semiconductor layer 1005 and the second p-type semiconductor layer 1406 formed between the first region and the second region as seen from a horizontal plane. Through the processes described above, the second p-type semiconductor layer 1406 in a convex shape can be formed on the first p-type semiconductor layer 1005.

In each of the transistor of this embodiment (the first, second, third, and fourth transistors), the first p-type semiconductor layer is made of $Al_xGa_{1-x}N$ ($0 \leq x \leq 1$), and the second p-type semiconductor layer is made of $Al_yGa_{1-y}N$ ($0 \leq y \leq 1$). Then, the layers may satisfy x=y. In this case, the first and second p-type semiconductor layers are made of the same material, and their lattice constants approach the lattice constants of the first and second semiconductor layers provided for forming a channel structure. Therefore, above the first and second semiconductor layers, the first and second p-type semiconductor layers can be epitaxially grown with crystal defects prevented from occurring.

The first p-type semiconductor layer is made of $Al_xGa_{1-x}N$ ($0 \leq x \leq 1$), and the second p-type semiconductor layer is made of $Al_yGa_{1-y}N$ ($0 \leq y \leq 1$). Then, the layers may satisfy x>y. In this case, the lattice constant of the first p-type semiconductor layer approaches the lattice constants of the first and second semiconductor layers provided for forming a channel structure, so that the first p-type semiconductor layer can be epitaxially grown with crystal defects prevented from occurring. Moreover, since the Al concentration in the second p-type semiconductor layer is lower than that of the first p-type semiconductor layer, the threshold voltage $V_{th1}$ below the gate electrode can be made higher. This is effective at providing a normally-off type transistor.

In each of the transistors of this embodiment, preferably, heterojunction formed at the interface between the first and second semiconductor layers is a junction composed of $Al_zGa_{1-z}N$ ($0<z \leq 1$) and GaN. In this case, by heterojunction between $Al_zGa_{1-z}N$ ($0<z \leq 1$) and GaN, spontaneous polarization or piezoelectric polarization can generate carriers with a high concentrations in the heterointerface, which allows a large current to flow during operation.

In each of the transistors according to the embodiment described above, the bottoms of the first and second grooves 1101 and 1102 provided on the second semiconductor layer 1004 may be formed, by over etching, below the top surface of the other portion of the second semiconductor layer 1004. With the transistor having such a structure, the same effects as shown above can also be provided.

As described above, the transistor and its fabrication method according to the present invention are useful for power transistors and the like for use in, for example, power supply circuits of consumer devices such as general-purpose inverters.

What is claimed is:

1. A transistor comprising:
   a substrate;
   a first semiconductor layer formed over the substrate;
   a second semiconductor layer provided on the first semiconductor layer, having a channel formed by heterojunction at the interface with the first semiconductor layer, and having a first region and a second region;
   a first p-type semiconductor layer formed on a region of the second semiconductor layer other than the first region and the second region;
   a second p-type semiconductor layer formed on the first p-type semiconductor layer;
   a gate electrode formed on the second p-type semiconductor layer; and
   a source electrode and a drain electrode formed on or above the first semiconductor layer and at both sides of the gate electrode as seen from a horizontal plane, respectively,
   wherein the first region is provided between the gate electrode and the drain electrode as seen from a horizontal plane, and the second region is provided between the gate electrode and the source electrode as seen from a horizontal plane.

2. The transistor of claim 1, wherein the first p-type semiconductor layer is provided so that a first groove having a bottom composed of the first region is interposed between the layer and the drain electrode in order not to come into contact with the drain electrode, and also so that a second groove having a bottom composed of the second region is interposed between the layer and the source electrode in order not to come into contact with the source electrode.

3. The transistor of claim 1,
   wherein the first p-type semiconductor layer includes: a third groove having a bottom composed of the first region; and a fourth groove having a bottom composed of the second region, and
   the first p-type semiconductor layer is separated by the third and fourth grooves into a first portion in contact with the source electrode, a second portion including a region thereof located below the gate electrode, and a third portion in contact with the drain electrode.

4. The transistor of claim 1, wherein the second p-type semiconductor layer has a convex shape in which a portion thereof located below the gate electrode has a greater thickness than the other portion thereof.

5. The transistor of claim 1, wherein the first p-type semiconductor layer has a convex shape in which a portion thereof in contact with the second p-type semiconductor layer has a greater thickness than the other portion thereof.

6. The transistor of claim 1, wherein the first p-type semiconductor layer is made of $Al_xGa_{1-x}$ ($0 \leq x \leq 1$), and the second p-type semiconductor layer is made of $Al_yGa_{1-y}N$ ($0 \leq y \leq 1$).

7. The transistor of claim 1, wherein the first p-type semiconductor layer is made of $Al_xGa_{1-x}N$ ($0 \leq x \leq 1$), the second p-type semiconductor layer is made of $Al_yGa_{1-y}N$ ($0 \leq y \leq 1$), and the layers satisfy $x \geq y$.

8. The transistor of claim 1, wherein the first region has a width in the gate length direction of 0.7 to 4.5 μm inclusive.

9. The transistor of claim 1, wherein in the state where a voltage at which the transistor turns into an off-state is applied to the gate electrode, a drain current flowing between the drain electrode and the source electrode has a value of 10−8 A/mm or lower.

10. The transistor of claim 1, wherein the source electrode and the drain electrode are in contact with the interface between the first semiconductor layer and the second semiconductor layer.

11. The transistor of claim 1, wherein the heterojunction is a junction composed of $Al_zGa_{1-z}N$ ($0 \leq z \leq 1$) and GaN.

12. The transistor of claim 1, wherein a first threshold voltage $V_{th1}$ below the gate electrode and a second threshold voltage $V_{th2}$ of a transistor formed as a virtual transistor in a region below the side of the gate electrode satisfy $V_{th1} - V_{th2} \geq 2.5$ V.

13. The transistor of claim 1,
   wherein the distance between the gate electrode and the source electrode is smaller than the distance between the gate electrode and the drain electrode, and
   the distance between the second p-type semiconductor layer and the source electrode is smaller than the distance between the second p-type semiconductor layer and the drain electrode.

14. The transistor of claim 1, wherein the levels of the first and second regions of the second semiconductor layer are equal to or lower than the level of the region of the second semiconductor layer other than the first and second regions.

* * * * *